(12) United States Patent
Miley

(10) Patent No.: US 7,244,887 B2
(45) Date of Patent: Jul. 17, 2007

(54) ELECTRICAL CELLS, COMPONENTS AND METHODS

(75) Inventor: George H. Miley, Champaign, IL (US)

(73) Assignee: Lattice Energy LLC, Chicago, IL (US)

(*) Notice: Subject to any disclaimer, the term of this patent is extended or adjusted under 35 U.S.C. 154(b) by 418 days.

(21) Appl. No.: 10/204,242

(22) PCT Filed: Feb. 26, 2001

(86) PCT No.: PCT/US01/06042

§ 371 (c)(1),
(2), (4) Date: Nov. 25, 2002

(87) PCT Pub. No.: WO01/63010

PCT Pub. Date: Aug. 30, 2001

(65) Prior Publication Data

US 2003/0159922 A1   Aug. 28, 2003

Related U.S. Application Data (60) Provisional application No. 60/267,616, filed on Feb. 9, 2001, provisional application No. 60/184,962, filed on Feb. 25, 2000.

(51) Int. Cl.
*H01L 17/00* (2006.01)
(52) U.S. Cl. .......... 136/205; 136/203; 136/227; 136/236.1; 136/230; 136/232; 136/233; 313/494; 313/506; 204/290.01; 204/290.03; 204/290.08; 204/290.14
(58) Field of Classification Search .......... 204/290.01, 204/290.03, 290.08, 290.14, 263, 266, 272, 204/232; 136/230, 232, 233, 236.1, 203, 136/205, 227; 313/494, 506
See application file for complete search history.

(56) References Cited

U.S. PATENT DOCUMENTS

| | | | |
|---|---|---|---|
| 4,043,355 | A | 8/1977 | Cerruti et al. |
| 4,414,064 | A | 11/1983 | Stachurski et al. |
| 4,943,355 | A | 7/1990 | Patterson |
| 4,966,674 | A | 10/1990 | Bannochie |
| 5,036,031 | A | 7/1991 | Patterson |

(Continued)

FOREIGN PATENT DOCUMENTS

GB   2058842   4/1991

(Continued)

OTHER PUBLICATIONS

Miley et al, "Electrolytic Cell with Multilayer Thin-Film Electrodes", Trans. Fusion Technology, Bol. 26, No. 4T, Part 2, pp. 313-330, (Dec. 1994).*

(Continued)

*Primary Examiner*—Bruce F. Bell
(74) *Attorney, Agent, or Firm*—Woodard, Emhardt, Moriarty, McNett & Henry LLP (57) ABSTRACT

Preferred electrode devices (10) including a substrate (11) and cathode (13) and anode material (12) coated thereon in discreet locations are described. The cathode materials desirably include multiple layers of thin metal films (14). Preferred cell devices including conductive elements and a solid state source of charged ions for migration into and through the conductive elements are also described.

38 Claims, 6 Drawing Sheets

U.S. PATENT DOCUMENTS

| | | | |
|---|---|---|---|
| 5,164,062 A | 11/1992 | Byrd et al. | |
| 5,281,485 A | 1/1994 | Colgan et al. | |
| 5,318,675 A | 6/1994 | Patterson | |
| 5,372,688 A | 12/1994 | Patterson | |
| 5,494,559 A | 2/1996 | Patterson | |
| 5,607,563 A | 3/1997 | Patterson et al. | |
| 5,616,219 A | 4/1997 | Patterson | |
| 5,618,392 A | 4/1997 | Furuya | |
| 5,618,394 A | 4/1997 | Patterson | |
| 5,628,886 A | 5/1997 | Patterson | |
| 5,628,887 A | 5/1997 | Patterson et al. | |
| 5,632,871 A | 5/1997 | Patterson | |
| 5,635,038 A | 6/1997 | Patterson | |
| 5,672,259 A | 9/1997 | Patterson | |
| 5,676,816 A | 10/1997 | Patterson | |
| 5,755,937 A | 5/1998 | Patterson et al. | |
| 5,767,612 A | 6/1998 | Takeuchi et al. | |
| 5,837,454 A * | 11/1998 | Cozzette et al. | 435/6 |
| 6,057,237 A | 5/2000 | Ding et al. | |
| 6,140,234 A | 10/2000 | Uzoh et al. | |
| 6,599,404 B1 | 7/2003 | Miley | |

FOREIGN PATENT DOCUMENTS

| | | |
|---|---|---|
| GB | 2278491 | 11/1994 |
| JP | 5134098 | 6/1993 |
| WO | WO 91/06103 | 5/1991 |
| WO | WO 91/06959 | 5/1991 |
| WO | WO 92/22907 | 12/1992 |
| WO | WO 93/14503 | 7/1993 |
| WO | WO 98/07898 | 2/1998 |

OTHER PUBLICATIONS

Miley, G.H., et al., "Multilayer Thin Film Electrodes for Cold Fusion," Frontiers of Cold Fusion, p. 659-662, XP002910912.

Miley, G.H. et al., "Electrolytic Cell with Multilayer Thin-Film Electrodes," Transactions of Fusion Technology, Dec. 1994, No. 4T, Pt. 2, pp. 313-320. XP000489732.

* cited by examiner

Fig. 7   Hydrogen from Hydride Reservoir

ELECTRICAL CELLS, COMPONENTS AND METHODS

REFERENCE TO RELATED APPLICATIONS

This application claims the benefit of U.S. patent application Ser. No. 60/184,962 filed Feb. 25, 2000, and of U.S. patent application Ser. No. 60/267,616 filed Feb. 9, 2001, each of which is hereby incorporated by reference in its entirety.

BACKGROUND

The present invention relates generally to electrical cells, and in one particular aspect to electrical cells having cathodes incorporating multiple thin film metal layers.

As further background, electrolytic cells of various designs have been proposed which incorporate multilayer thin films. For example, Miley et al. used flat stainless steel plates coated with multilayer thin films as electrodes for an electrolytic cell. Such experiments are described in G. Miley, H. Hora, E. Batyrbekov, and R. Zich, "Electrolytic Cell with Multilayer Thin-Film Electrodes", *Trans. Fusion Tech.*, Vol. 26, No. 4T, Part 2, pp. 313–330 (1994). In this prior work, alternating thin-film (100–1000 Angstrom) layers of two different materials (e.g. titanium/palladium) were employed. Others have proposed the use of packed-bed electrolytic cells where small plastic pellets are coated with several micron-thick layers of different materials. See, e.g., U.S. Pat. Nos. 4,943,355; 5,036,031; 5,318,675 and 5,372,688. Still other electrolytic cells have employed coated electrodes of various forms. For example, U.S. Pat. No. 4,414,064 entitled "Method For Preparing Low Voltage Hydrogen Cathodes" discusses a co-deposit of a first metal such as nickel, a leachable second metal or metal oxide, such as tungsten, and a nonleachable third metal, such as bismuth.

In light of these prior efforts, there remains a need for additional improved and/or alternative electric cell designs which incorporate thin-film (e.g., 50–1,000-Å-thick layers) electrode configurations. The present invention addresses this need.

SUMMARY OF THE INVENTION

The present invention provides, in one aspect, an electrode device including a substrate and an anode and cathode provided in discreet locations on the substrate and thus having a gap therebetween. The preferred cathode includes multiple thin metal layers, desirably having alternating layers of at least two different metals. The thin metal layers are at least partially encapsulated by a diffusion barrier layer that is relatively impermeable to atomic hydrogen species such as ions of hydrogen or its isotopes (e.g. protons or deuterons). Operation of the electrode device in the presence of an electrolyte (e.g. an aqueous electrolyte, optionally including heavy water) filling the gap and contacting the electrode surfaces results in the electro-migration of the ions (e.g. protons or deuterons) within the cathode and the creation of a region in the cathode enriched in these ions.

In another embodiment, the invention provides a method for obtaining a region within an electrically-conductive element enriched in ions of hydrogen or its isotopes. The inventive method includes enriching a region of the element in the ions by electro-migration of the ions. In preferred modes, the element or at least a portion thereof is coated with a diffusion barrier that resists permeation by the ions. Additionally, the element desirably includes multiple metal layers, including for instance two or more different metals preferably arranged in an alternating fashion. Such an element can be operated as a cathode in a so-called "wet chemistry" cell in which a liquid electrolyte is employed, or may be operated as an element in a dry cell in which no liquid electrolyte is needed, e.g. as described in certain devices herein.

Another embodiment of the present invention relates to a cell arrangement which comprises an electrically conductive element including a metal in ions of hydrogen or its isotopes (e.g. protons or deuterons) are soluble, and anodic and cathodic connections to the conductive element. A solid-state source of the ions is provided and arranged to feed the ions into the conductive element. For example, such a solid-state source can include a metal hydride or a corresponding deuteride for release of hydrogen or deuterium in gaseous form, and a catalyst for splitting the gaseous hydrogen or deuterium so as to provide protons or deuterons. The catalyst may be layered onto the conductive element, and the metal hydride may be layered onto the catalyst. In this fashion, gas released by the metal hydride (e.g. by heating) immediately contacts the catalyst to provide protons or deuterons, which can then migrate into and along the conductive element when a voltage drop is applied across the element. Preferred arrangements include a barrier layer along at least a portion of the conductive element that resists permeation by the protons or deuterons. Cell arrangements of this embodiment may advantageously be incorporated into various geometric devices such as the cylindrical cell devices as described further herein.

The present invention provides improved and alternative cell designs, components therefor, and uses thereof. Additional embodiments as well as features and advantages of the invention will be apparent from the descriptions herein.

DESCRIPTION OF THE PREFERRED EMBODIMENTS

For the purpose of promoting an understanding of the principles of the invention, reference will now be made to certain preferred embodiments thereof, and specific language will be used to describe the same. It will nevertheless be understood that no limitation of the scope of the invention is thereby intended; such alterations, further modifications and applications of the principles of the invention as described herein are being contemplated as would normally occur to one skilled in the art to which the invention relates.

The present invention provides electrical cells and related components and methods. Preferred cells will be operable using wet or dry chemistries, and will desirably incorporate metal elements having multiple thin metal layers.

Figure 1:
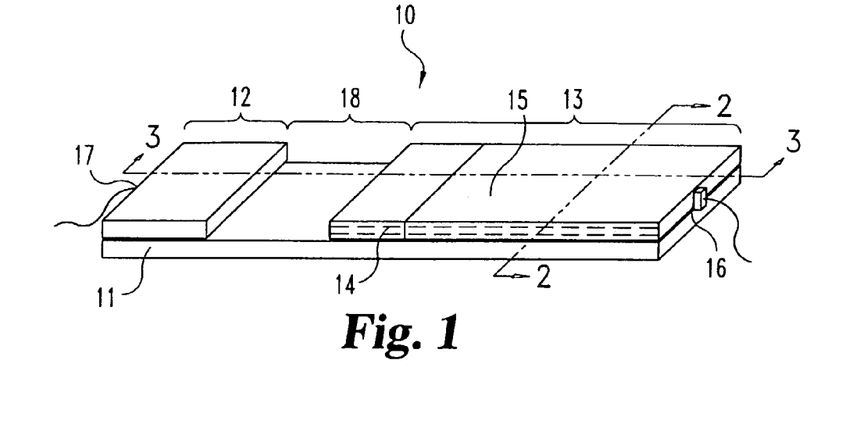
FIG. 1 provides a perspective view of a preferred electrode device of the invention.
Figure 2:
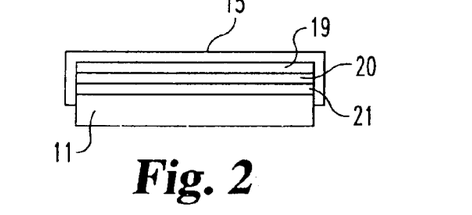
FIG. 2 provides a cross-sectional view of the device of FIG. 1 taken along line 2—2 and viewed in the direction of the arrows.
Figure 3:
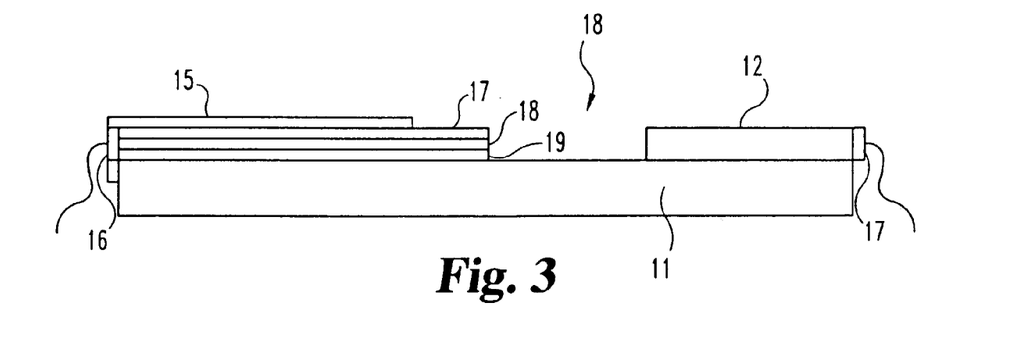
FIG. 3 provides a cross-sectional view of the device of FIG. 1 taken along line 3—3 and viewed in the direction of the arrows.

With reference now to FIGS. 1–3, shown is a preferred electrode device of the invention. Electrode device 10 includes a substrate 11 made of a suitable material. Since the substrate is preferably not electrically conductive, materials such as cross-linked polymers, ceramics, or glass can be employed, as well as suitable metals and/or metal oxides.

Figure 1A:
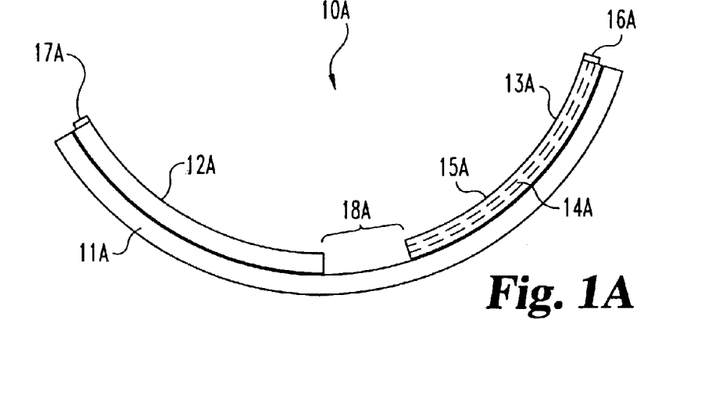

Substrate 11 as shown is generally planer, although substrate 11 can have other configurations including for example convoluted or curved configurations, preferably incorporating concave surfaces upon which electrode metals, particularly cathode metals (see e.g. FIG. 1A), are positioned. Electrode device 10 generally includes an anode 12 and a cathode 13 positioned on the substrate in discreet locations.

Anode 12 can be made of any suitable conductive material, including for example metals such as platinum. The preferred cathode 13 includes a plurality of thin metal layers 14, for example having a thickness no greater than about 1000 Angstroms, e.g. from about 50 to about 1000 Angstroms, and a diffusion barrier layer 15. Diffusion barrier 15 is relatively impermeable to hydrogen or its isotopes. In this regard, a diffusion barrier that has a low diffusion coefficient for hydrogen or deuterium can be made, for instance, from chromium, silica, glass or the like. Such a layer will retard excessive outward diffusion of ions of hydrogen or its isotopes. This, then, enhances the ability to obtain a concentrated or enriched region of the ions (e.g. protons or deuterons). Values above 0.5 hydrogen/deuterium atoms per host atom (palladium, nickel, etc.) are generally viewed as reflecting an advantageous enrichment, more preferably above 0.8 hydrogen/deuterium atoms per host atom.

Barrier layer 15 covers the top and side surfaces of the metal layers 14 over a portion of the metal layers 14. As shown in the illustrated device, barrier layer 15 covers approximately 60% to 75% of the length of the the metal layers 14 closest to a cathodic electrical connection 16. In this fashion, a portion of the layers 14 is exposed to contact by an electrolyte, and another portion of the layers 14 closer to the cathodic connection 16 is encapsulated by the barrier layer 15. Electrode device 10 further includes an electrical connection 17 for the anode. In addition, electrode device 10 includes a gap 18 separating the anode 12 from the cathode 13, such that the anode and cathode are discreetly located upon the substrate 11. In this and other devices of the invention, the cell is preferably designed and equipped such that the electrical current runs parallel to or along the planes of the thin film layers, including for example along their greatest length in the case of rectangular films. Preferred cell designs will have the capacity to provide current densities within the thin films 14 of at least 1 kA/cm$^2$, preferably providing multi-kA/cm$^2$ within the films. The high current densities provided will create an electric field which enhances the flow of ions such as protons or deuterons, achieving higher ion densities near the negative connection to the layers.

With reference now particularly to FIGS. 2–3, layers 14 preferably include layers of alternating types of metal, shown as layers 19, 20 and 21. Although in the illustrated device three such layers are shown, any number of layers can be included, for example 2 to 20 layers or more. Preferably, layers 14 include alternating metal layers of at least two different types of metal. Illustratively, layers 19 and 21 may be made from a metal in which hydrogen or its isotopes are relatively soluble, including for example palladium. Layer 20 can then be made of a differing type of metal, desirably one which creates a large Fermi level difference between the layer 20 and the layers 19 and 21.

Suitable metals for these purposes are disclosed for example in international publication number WO98/07898, which is hereby incorporated herein by reference in its entirety. For purposes of convenience, the following text incorporates disclosure also found in this publication.

An advantageous design of a thin-film coated electrode generally involves the selection of materials with Fermi-level differences and hydrogen and deuterium absorption properties as described in G. Miley, H. Hora, E. Batyrbekov, and R. Zich, "Electrolytic Cell with Multilayer Thin-Film Electrodes", *Trans. Fusion Tech.*, Vol. 26, No. 4T, Part 2, pages 313–320 (1994), plus consideration of the expansion properties of the selected materials. Since considerable compression can be tolerated before buckling and flaking of the thin-film layers occurs, the expansion matching of the materials employed in the thin-film layers need not be perfect. Thus, a fairly wide range of material choices can be considered from among combinations of materials that might be paired to obtain large Fermi-energy-level differences, while still offering good solubility and diffusivity of hydrogen and deuterium ions. Table I below categorizes various materials into groups according to their Fermi Level, and is adapted from "Fermi Energy Levels (in eV)," cited in J. C. Slater, Introduction to Chemical Physics, 1st ed., McGraw-Hill, New York, N.Y., 44 (1939).

TABLE I

Fermi Energy Level, eV for Various Groups of Metals

| Low | | Intermediate 1 | | Intermediate 2 | | Intermediate 3 | | High | |
|---|---|---|---|---|---|---|---|---|---|
| Cs | 1.6 | Na | 3.1 | Ta | 5.2 | Pt | 5.9 | Fe | 7.0 |
| Rb | 1.8 | Ce | 3.4 | Ti | 5.4 | Pd | 6.1 | Cu | 7.0 |
| K | 2.1 | Th | 3.5 | Ag | 5.5 | Co | 6.2 | Ni | 7.4 |
| | | | | | | Bi | 6.3 | | |
| Sr | 2.5 | U | 3.5 | Al | 5.6 | Pb | 6.3 | Be | 9.0 |
| Ba | 2.3 | Mg | 4.5 | Au | 5.6 | Rh | 6.3 | | |
| Ca | 3.0 | Zr | 4.5 | W | 5.8 | V | 6.3 | | |
| | | Li | 4.7 | Mo | 5.9 | Ir | 6.3 | | |
| | | Cd | 4.7 | Zn | 5.9 | Os | 6.3 | | |
| | | | | | | Ru | 6.4 | | |

Pairing high- and low-Fermi level materials gives the maximum difference in Fermi level, for example, Cs/Be gives ΔF=7.4 eV, where ΔF represents the difference in Fermi energy level. However, from other standpoints, such as ease of manufacture, diffusivity, and solubility, other combinations may be desirable. Thus, alternating layers of Pd/Ni (ΔF=1.3 eV), Pt/Ni (ΔF=1.5 eV), and Pd/Fe (ΔF=0.9 eV) have been used in work thus far as a compromise among these differing factors. These choices used combinations of metals from the intermediate 3 and high groups. Other convenient choices include intermediate 3 and intermediate 1 metals such as Pd/Zr and Pt/Th (ΔF=1.6 and 2.4 eV, respectively). In any event, it is preferred that material pairs be employed which provide a ΔF of at least about 1 eV.

It should be noted that similar considerations extend to the interfaces between the thin-film layers, the structural substrate, and the outer surface exposed to the electrolyte or the thin film and barrier surface coating. Advantageous designs will thus take into account the provision of ΔF at the outer surface, plus all internal interfaces.

In addition to ΔF considerations, the materials selected also preferably have the ability to allow the hydrogen or deuterium (H/D) ions entering the electrode or element as a result of electrolytic action to easily diffuse through the layers, allowing large quantities of the ions to be absorbed in all layers. Consequently, desirable material pairs offer both reasonably high H/D diffusion coefficients (on the order of that for palladium or higher) and an H/D solubility also on the order of that of palladium or higher.

In summary, optimum materials for the alternating thin-film coating can be selected based on favorable ΔF, diffusivity, and solubility parameters.

The diffusivity and solubility parameters for some materials which may be used are given in Table II. Since the thin-film layers typically experience an elevated temperature due to a combination of ohmic heating associated with the electrolysis current and heat input from reactions taking place in the layers, the solubility should not decrease drastically at the operational temperature. Combinations of Pd, Ni, Fe, and Ti are examples of materials that meet the desired criteria. For example, Ni and Ti have diffusion coefficients that are close to that of Pd, so Pd/Ni and Pd/Ti offer convenient combinations which can be used in the invention.

TABLE II

| Metal | Diffusivity, D, and Solubility, C, for Various Materials | |
|---|---|---|
| | $D(cm^2 sec^{-1})$ | $C(g\ atom\ cm^{-1})$ |
| Pd | $3 \times 10^{-7}$ | $3 \times 10^{-4}$ |
| Ni | $1 \times 10^{-9}$ | $1 \times 10^{-5}$ |
| Fe | $6 \times 10^{-5}$ | $4 \times 10^{-9}$ |
| Fe-Ni alloy | $1 \times 10^{-10}$ | $4 \times 10^{-6}$ |
| $Fe_2O_3$ | $1 \times 10^{-18}$ | |
| $Cr_2O_3$ | $1 \times 10^{-16}$ | |

J. O'M. Bockris, M. A. Genshaw, and M. Fullenwider, *Electrochim. Acta*, 15, 47 (1970); W. Beck, M. O'M. Bockris, M. A. Genshaw, and P. K. Subramanyan, *Met. Trans.*, 2, 883 (1971); P. K. Subramanyan, Comprehensive Treatise of Electrochemistry, eds. J. O'M.

Other advantageous material combinations also exist. A variety of materials have a higher solubility than Pd, especially at higher temperatures. Thus, from this standpoint, as well as from the view of their diffusivity, V, Ta, Zr, Ce, and Th are examples of additional materials that are good candidates for pairing with Pd. Examples are Pd/Zr, Pt/Th, and Be/Th (ΔF=1.6, 2.4, and 5.5 eV, respectively).

An additional consideration for selection of the material pairs is the requirement that minimal self-diffusion occurs, such that reasonably sharp material boundaries at the interfaces are maintained. Frequently, thin metallic films tend to diffuse into each other, such that the stability of the interface between them is compromised. This interdiffusion is attributed to both of the metals in the pair having high diffusion coefficients. The Ni/Pd and Ti/Pd material pairs used in work thus far have shown minimal interdiffusion, as measured by Auger electron scanning. This is consistent with other results reported in the literature. Multilayered thin-film structures of Fe/Ti and Pd/Ti pairs have been studied extensively for their stability. (P. Borgesen, R. E. Wistrom, and H. H. Johnson, *J. Mater. Res.*, 4, 821 {1989].) Experiments involved the study of interdiffusion of such films as a result of irradiation and hydrogen loading. Fe/Ti and Pd/Ti pairs were found to be relatively stable, compared to a variety of other combinations.

In summary, once material pairs are selected on the basis of ΔF, diffusivity, and solubility, then minimization of interdiffusion between the pairs can also be considered. If diffusion coefficient data are not available, conventional Auger electron microscopy of sample structures can be performed to measure metal profiles near interfaces to insure that substantial interdiffusion does not exist.

Based on the foregoing reasoning, plus the need for easy fabrication, work to date has generally employed alternating layers of Pd/Ni (ΔF=1.3 eV) or Pd/Ti (ΔF=0.7 eV). Combinations such as Pd/Zr, Pt/Th, and Be/Th (ΔF=1.6, 2.4, and 5.5 eV, respectively) are other attractive combinations.

In devices such as device 10 and other devices of the present invention, the cathode including the thin films 14 may be provided on a curved surface such as a concave surface, or may be provided in a segmented fashion as disclosed in WO WO98/07898 to effectively provide expansion joints to retard any deterioration of the films.

Figure 4:
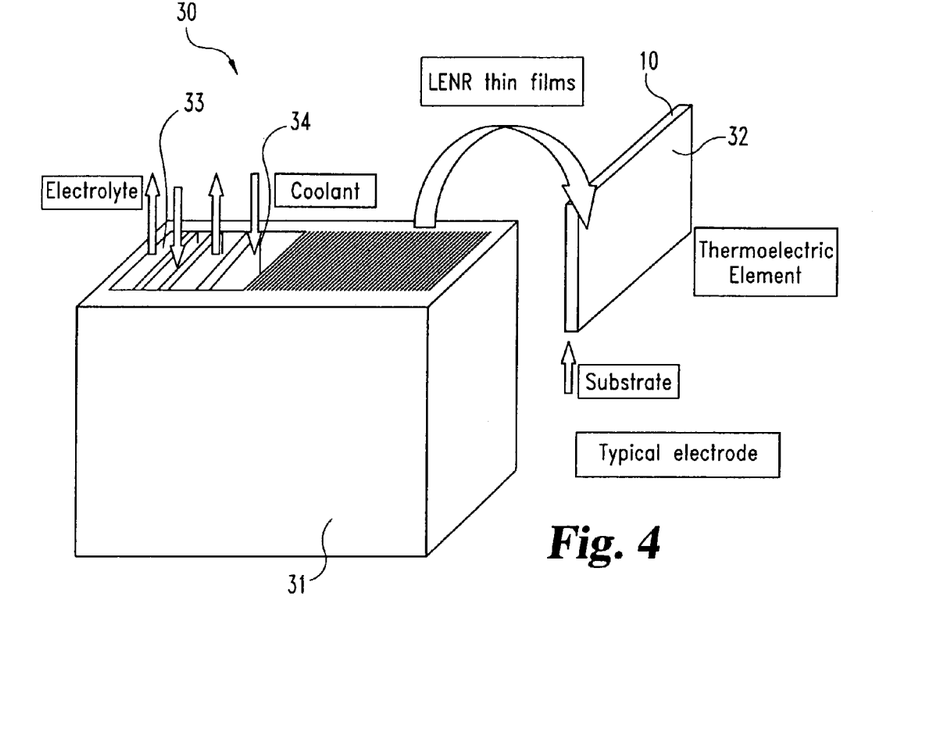
FIG. 4 provides a perspective view of an electrolytic cell device of the invention incorporating a plurality of electrode devices as illustrated in FIGS. 1–3.

With reference now to FIG. 4, if desired, a plurality of electrode devices 10 may be incorporated into an electrolytic cell. For example, shown in FIG. 4 is such an electrolytic cell 30 incorporating a plurality of electrode devices 10. Cell 30 includes a plurality of electrode devices 10 suitably mounted therein inside a durable, non-conductive housing 31. In applications including the recovery and/or conversion of heat, cell 30 may also include a plurality of thermoelectric converter elements 32. The thermoelectric elements 32 and the devices 10 can be bonded to one another in a back-to-back fashion or otherwise thermally coupled in a fashion facilitating heat transfer from the devices 10 to the elements 32. For instance, in one embodiment, the thermoelectric element may serve as the substrate for the anode and cathode materials. These combined structures and then arranged in the cell 30 leaving spaces 33 for electrolyte flow and spaces 34 for coolant flow through the cell 30. Spaces 33 for electrolyte flow occur on the electrode sides of the combined electrode/thermoelectric structures, providing the electrolyte for the operation of the devices 10. Spaces 34 for coolant occur on the thermoelectric element side of the combined structures. In this fashion, as the cell is operated, a temperature differential can be created across the thermoelectric converter elements 32, thus promoting the generation of electric energy.

Figure 5:
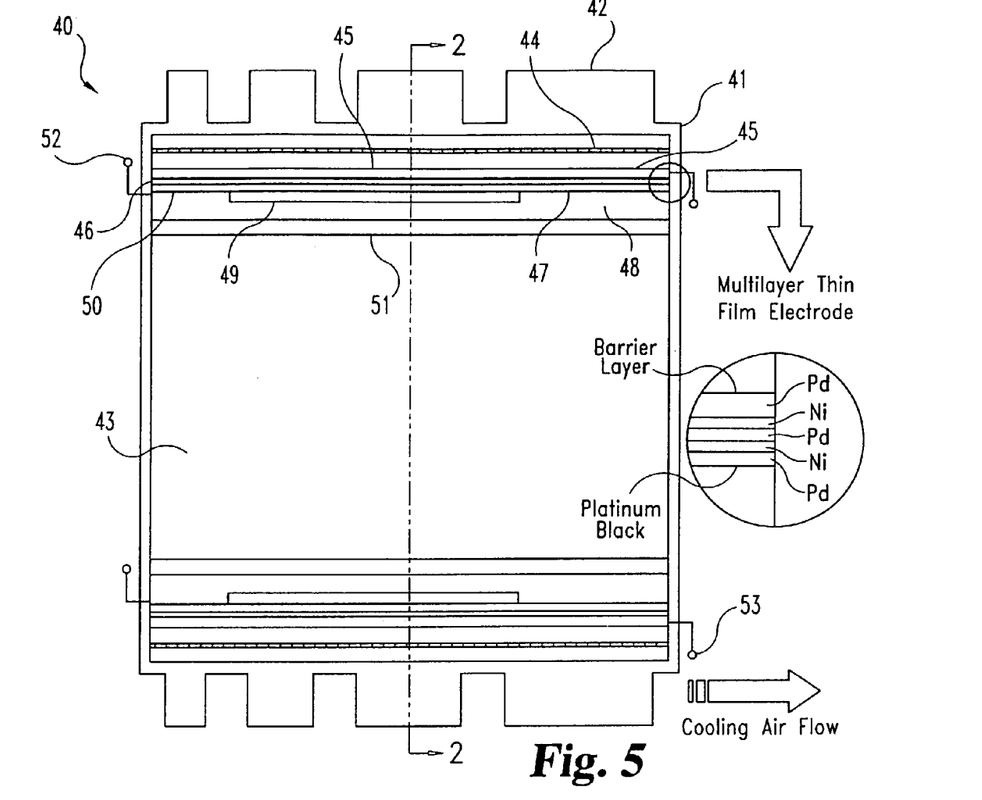
FIG. 5 provides a cross-sectional view of a cylindrical cell device of the invention taken along the axis of the device.
Figure 6:
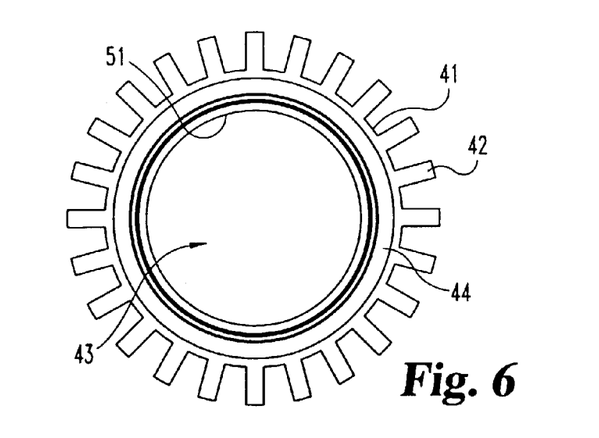
FIG. 6 provides a cross-sectional view of a cylindrical cell device of the invention taken perpendicular to the axis of the device.
Figure 7:
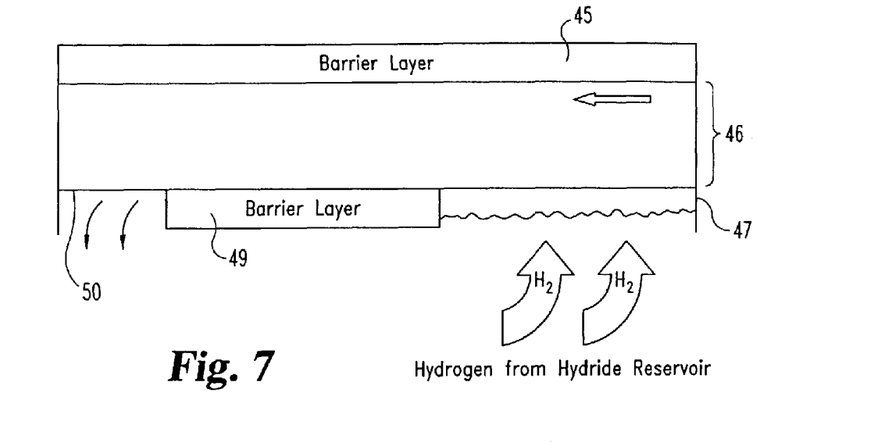
FIG. 7 provides a diagram illustrating an operation of the device shown in FIGS. 5–6.

With reference now to FIGS. 5–7, shown is another embodiment of the invention. Shown is an electric cell 40 in which structures are arranged in a cylindrical fashion. Preferably, such a cylinder has a circular cross-section, although other cross-sections such as elliptical, rectangular, square, triangular, or irregular cross-sections are possible. Cell 40 includes a cylindrical support member 41, preferably also having heat exchange structures external thereof for dissipating heat, for example including fins 42. Support 41 defines an internal space 43, containing other elements of the cell. In particular, a thermoelectric converter element 44 is thermally connected to support 41. In this regard, the thermoelectric element and other elements described herein internal of the support 41 are preferably constructed in a shape corresponding to the interior wall of the support member 41. Adjacent the thermoelectric converter, provided is a diffusion barrier layer 45 which is relatively impermeable to hydrogen or its isotopes, as described elsewhere herein. Inside of barrier 45 are located thin metal films 46, having features such as described above in connection with devices 10. Extending over a portion of the length of the films 46 is a catalyst layer 47. Catalyst layer 47 contains a catalyst for converting gaseous hydrogen or isotopes thereof into corresponding ionic forms such as protons or deuterons. Catalyst layer 47 can include, for example, platinum black, which is well known for these purposes. A metal hydride layer 48 is provided within the catalyst layer. A diffusion barrier layer 49 is provided separating a portion of the hydride layer 48 from the thin film layers 46. Barrier layer 49 and catalyst layer 47 are arranged along the hydride layer 48 such that catalyst layer 47 separates thin film layer 46 from hydride layer 48 along a portion, and barrier layer 49 adjoins the catalyst layer and separates the hydride layer 48 from the thin film layer 46 along a further length thereof. At the opposite end of barrier layer 49, there is provided a gap 50 in which the thin film layers 46 are not separated from the hydride layer by a barrier layer, allowing for diffusion of ions of hydrogen or its isotopes from the thin metal layers 46 into the hydride layer 48. Provided also is an oxide layer 51 which is semi-transparent to hydrogen or its isotopes. Used in this context, semi-transparent is intended to mean that the layer 51 will admit gaseous hydrogen or its isotopes readily into the hydride layer 48, but will resist flow of gaseous hydrogen or its isotopes in the opposite direction.

The metal hydride layer 48 can be loaded, for example, by heating the layer 48 in the presence of gaseous hydrogen or its isotopes. This will promote the uptake of hydrogen or its isotopes into the metal hydride layer 48, creating a solid-state source of hydrogen or its isotopes. Further, cell device 40 may be constructed as a closed container, and can remain pressurized with gaseous hydrogen or its isotopes prior to and during use, to maintain an equilibrium concentration of hydrogen or an isotope thereof relative to the hydride layer 48, further minimizing any "backflow" of hydrogen or its isotopes out of the hydride-semi-transparent layer region.

With reference in particular to FIG. 7, in an illustrative the operation of the cell 40, electrical current is passed through the metal films 46 via anodic and cathodic attachments located and the ends of the films. This results in heating the films 46, which transfers heat to the metal hydride layer 48. Hydrogen is released from hydride layer 48, passes into catalyst layer 47, and is converted to protons. The electric field within the metal films 46 causes an electro-migration of the protons toward the anode. At the same time, barrier layer 49 prevents the protons from re-entering the hydride layer within the length of the metal films 46 covered with barrier layer 49. A highly concentrated area of proton flow will thus be created in the regions of the metal film structure 46 adjoining the barrier layer 49. Protons will ultimately traverse beyond the barrier layer 49, and can re-enter the hydride layer 48 through the gap 50 located adjacent the anode. During this operation, gaseous hydrogen within the cell 40 can diffuse into the hydride layer 48 to replenish the hydrogen source.

Figure 8:
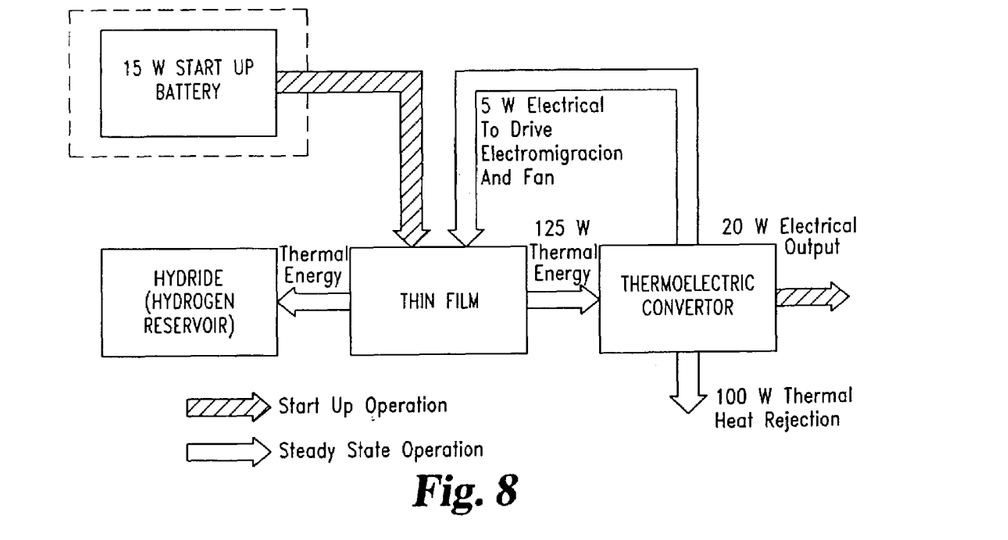
FIG. 8 provides a diagram of an energy converting apparatus incorporating a device as illustrated in FIGS. 5–7.

With reference now to FIG. 8, illustrated is the operation of cell 40 in an energy conversion apparatus including the cell 40 and an external battery 100. During a start-up phase, the external battery 100 is used as a power source to drive a current through the metal film structure 46 of the cell 40 and, if desired, to also heat the hydride layer through a separate resistive heater element. When sufficient electricity is provided by the thermoelectric converter element 44, such electricity can be used to drive current through the thin film structure 46, the start-up battery can be disconnected, and the cell 40 can then be allowed to operate in a self-sufficient manner.

It will be understood that in the operation of the cell 40 in a manner including the conversion of heat energy to electricity, a heat sink will be provided to the external surfaces of the cell 40. This may include for example a flowing fluid such as a gas or a liquid to dissipate heat and thereby facilitate the generation of a thermal gradient across the thermoelectric element 44. As to the use of metal hydrides as a hydrogen source in the invention, two basic properties that make metal hydrides attractive are their high and reversible storage capacity per mole of compound, and the high energy stored per unit volume. The mass of hydrogen that can be stored by unit volume of hydride is almost twice what can be stored in liquid form and thrice than as a highly compressed gas. Hydrogen is also much more stable as a hydride since as a liquid it requires cryogenic storage tanks and as a gas it requires high-pressure tanks (~5000 psi). One drawback is the low hydrogen weight percent, which in most hydrides ranges about 2%. Nevertheless, the energy stored in a liter of hydride may range around 1 MJ. Companies are developing new hydrides that can achieve up to 7% weight in hydrogen content, for example Energy Conversion Devices of Troy, Mich. has materials in this area.

Illustrative candidates for high density hydrogen storage include $LaNiH_x$ and $FeTiH_x$. Additional candidates with their properties are shown in Table III below.

TABLE III

Storage Properties of Various Hydride Materials*

| Material | $H_2$ Volume Density [g/dm$^3$] | Energy [MJ/kg$^{-1}$] | Density [MJ/dm$^3$] |
|---|---|---|---|
| $MgH_2$ | 101 | 9.9 | 14 |
| $FeTiH_{1.95}$ | 96 | 2.5 | 13.5 |
| $LaNi_5H_{6.7}$ | 89 | 2 | 12.7 |

*Taken from Material Science and Technology. Vol. 3B. Part II. Cahn, Haansen and Kramer. Weinhein. New York, 1994.

Many other hydrides are known and their selection and use in the present invention will be well within the purview of those working in this area.

For certain applications of the invention, it will not be necessary to consider the recharging properties of the hydride materials. It should be noted, however, that most of the hydrides can be generally be recharged with times that range from seconds to hours depending of the particular system and conditions. Some hydrides are also very tough, for example $AB_2$ compounds used by Daimler-Benz allow up to 3900 charge and discharge cycles with charging up to 80% in 10 minutes. The Ovonic division of Energy Conversion Devices, Troy, Mich., also has a proprietary alloy based magnesium hydride which can undergo 650 charge and discharge cycles with negligible degradation.

Concerning the catalyst layer, platinum black (Pt-black) is a fine platinum metal powder with particle size typically in the range of 0.1–0.5 μm. Due to its fine structure, Pt-black powder possess a black color, owing to large light absorption by free electrons. Pt-black can be obtained by the different known techniques, including an electrochemical process. This involves a method where different Pt-salt water solutions are utilized (typically chlorides) at determined pH conditions. The Pt-black powder produced by the electrochemical technique can easily be deposited on a cathode surface directly from the electrolyte by electrolysis at low current densities. The thickness of the Pt-black layer on the cathode surface can be controlled by varying the electrolysis current density and duration.

Pt-black powder is a highly efficient catalyst for molecular hydrogen dissociation to atomic hydrogen [10-11], i.e. causing the reaction ($H_2 \to H+H$). The yield of atomic hydrogen in the dissociation reaction depends on temperature and at T~600 K is close to 100%. Moreover, Pt black cannot be loaded with hydrogen because the Pt metal has very low affinity to hydrogen. Due to the gross value of specific surface of Pt-black (S~10–100 $m^2/g$), a thin layer of this powder (about 0.1 micron thick) will be sufficient to totally dissociate hydrogen molecules entering the layer due to a hydrogen gas pressure in the 1 to 10 atmosphere pressure range; therefore this process appears well suited for loading of the multiple layer thin film (MLTF) system with pure atomic hydrogen.

Those properties of Pt-black make it possible to utilize a Pt-black coating in the hydrogen loaded MTLF system as an ideal $H_2$ to atomic hydrogen converter (without losses of atomic hydrogen H in it). This provides an opportunity to carry out the "dry" electrolysis process with MLTF cathode when DC/AC voltage is applied to it, as described for the cell 40 above.

As discussed above, in order to decrease the hydrogen losses and in $MeH_x$, hydride/MLTF system, it is preferable to use a semi-transparent (in reference to hydrogen) oxide film (layer 51, FIGS. 5–6) which is coated on the free surface of hydride layer. As shown in Refs. [9–10] different oxide coatings such as $Al_2O_3$, $SiO_2$, PdO, $MnO_2$ may be utilized as semi-transparent barriers in reference to hydrogen loaded into metals. The principal of creating of semi-transparent transition at the metal surface having high affinity to hydrogen (MeHx) requires utilization of a large difference of Fermi levels in oxide and metal. The thin layers of oxides presented above (about 200–500 Anstroms thick) are transparent with reference to hydrogen atoms/molecules in the process of their absorption from the gas phase or upon the liquid phase electrolysis already at room temperature. These layers are not loaded with hydrogen by themselves, but operate as a direct transition of hydrogen atoms to metal, where the loading occurs. When the loading of the metal is complete, at the interface between the metal and oxide layer, a Double Electric Layer (DEL) is built up. As a result, positively charged protons (in loaded metals such as Pd, Ti, Mg) cannot penetrate through the DEL at the metal/oxide interface to "vacuum" (or, for instance, return into gas phase) because they will be retarded by the DEL. In the case under consideration, the meta-oxide interface, in reference to protons, is operated as metal-dielectric transition in reference to electrons in semiconductor diode. Thus, due to a strong difference between oxide and metal Fermi levels, the hydrogen becomes trapped inside the metal.

The oxide layers can be deposited on the metal surface by sputtering or any other suitable techniques.

In order to produce a low weight heat sink and fins, it will be preferred instead of Al to use modern semiconducting polymer materials known as doped poly-acetylene (PA) [12]. The advantage of this material compared to the usual metals is that it has density of only 1.0 g/cm3, that is 2.7 time less than the specific weight of Al. Moreover, PA materials are polymers with a high degree of conjugated bonds doped with alkaline metals, and possess high thermo and electric conductivities that are comparable to metals. PA materials may also easy operate at high temperatures (more than 800° C.).

In addition to optimization of materials, recent work at NEC Corporation to develop high efficiency cooling for advanced computers has shown that an aerodynamic design of the fin structure can significantly increase heat transfer rates [5]. Such a design can be adapted to the cell fin configuration in the present invention. In addition to incorporating an aerodynamic cross-section, the lengths of the fins are progressively increased downstream from the flow entrance.

Devices of the invention can be used for example in the electrolysis of electrolytes such as water, forming hydrogen and oxygen gases, and may also be used in energy conversion devices or cells which include the generation of heat and optionally conversion of the heat to electrical energy, and/or in causing transmutation reactions. Devices of the invention may also be used to provide densified regions of ions or hydrogen or its isotopes, increasing the probability of and facilitating the further study of ion-ion reactions or ion-metal reactions, including exploring fusion and related reactions.

For the purpose of promoting a further understanding of the present invention and its principles and advantages, the following specific Examples are provided. It will be understood that these Examples are illustrative, and not limiting, of the invention.

EXAMPLES

1. Plate-Type Electrodes Including Cathode and Anode

Research has demonstrated that proton-metal reactions can be created by loading multi-layer thin films (MTLFs) with protons to achieve a loading ratio of approximately 0.9 protons per atom of palladium (Palladium is typically a basic constituent of the MLTF which is composed of alternate layers of metals such as nickel and palladium of thickness roughly 500–1000 A per layer). The exact mechanism driving the proton reaction is still under study, but the present view is that once this loading is achieved, a coherent structure, termed the gamma phase [1], is created that incorporates the protons and the lattice atoms. These coherent structures in turn permit tunneling-type reactions and provide a lattice recoil mechanism to absorb the energy released, resulted in heating of the MLTF. Experimental studies described herein using the MLTF configuration and loading methods disclosed herein have demonstrated this mechanism, achieving specific powers in excess of 500 W per gram of MLTF. Reactions can be achieved over extended periods providing the high proton loading and non-equilibrium ion/electron flow conditions can be maintained.

For these experiments, an electrode device was constructed generally as described in connection with FIGS. 1–3 above. In this design, the MLTF section was sputtered on the lower section of the substrate and served as the cathode. The cathode included a total of 5 thin film layers, prepared as alternating layers of palladium and nickel. Palladium served as the first and last metal layers of the cathode (not counting the chromium barrier layer). The anode, typically platinum, was placed on the top of the substrate plate with a gap between the two. An objective of this design is to cause the electrical flow (from anode to cathode via electrolyte that fills the gap) to flow parallel to the MLTF surface. This creates a high current density and maximizes the voltage drop (giving a maximum electrical field) in the films due to their small cross section perpendicular to the current flow direction. The electric field. in the MLTF serves to drive protons that enter the film towards the lower end (towards the cathode electrical connector). This flow causes the proton concentration in the MLTF to maximize at the lower end of the cathode, maximizing reactions and reaction potentials in that region. To insure a high loading occurs in this region, the lower two-thirds of the cathode surface (electrolyte interface side) was coated with a thin (<100 A) barrier layer formed of chromium to reduce diffusion of the protons out of the film. In summary, these two features, a high hydrogen loading (approaching 0.9 atoms hydrogen per atom MLTF metal), and a high current density (approaching 1 kA/cm$^2$) are advantageous features of this electrode. This then makes a high reaction rate possible, giving heat source rates over 500 W/g of MLTF metal.

Figure 9:
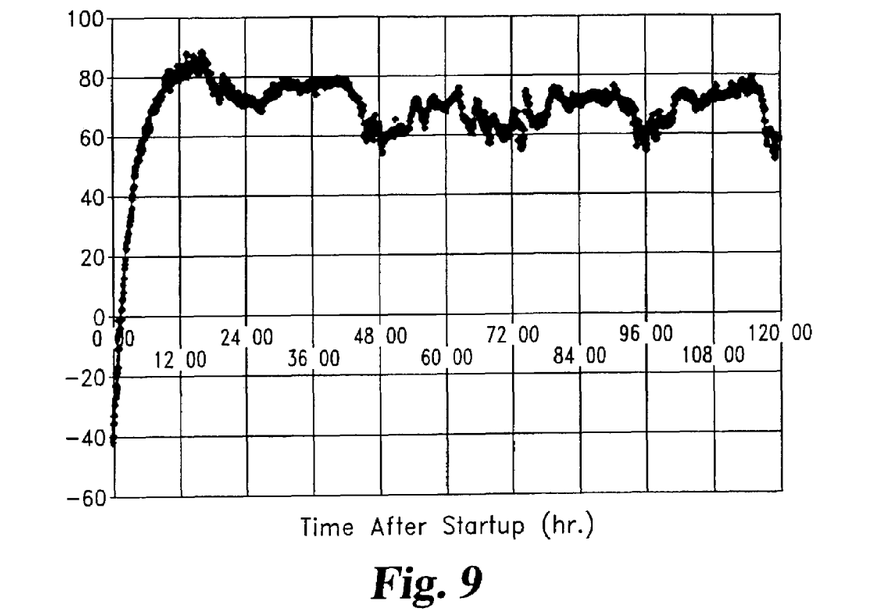
FIGS. 9–11 show graphical data resultant from runs described in Example 1.

The electrode device was inserted in a small, well-insulated Dewar along with appropriate temperature sensors to perform calorimetry. Considerable effort and development was expended on the film deposition technique to achieve good bonding, i.e. provide a reasonable lifetime despite the severe conditions of loading and heating encountered during operation. These techniques are described in [14]. These preliminary cells were purposefully designed to operate at relatively low powers and temperatures (few 100 mW and <30° C.) to simplify operation. 12 runs have been carried out with various thin-film coatings. Further details about the operating conditions, calibration, and data analysis are presented in [14]. A plot of the excess power measured during a typical run is shown in FIG. 9 and the excess power results for all 12 runs are summarized in Table IV.

TABLE IV

Summary of Initial Runs

| Cell | Input Power mW | Excess Power MW | Percentage Excess Power |
|---|---|---|---|
| 1 | 440 | 308 | 70 |
| 1 | 210 | 189 | 90 |
| 1 | 115 | 103 | 90 |
| 1A | 139 | 122 | 88 |
| 1A | 758 | 500 | 66 |
| 1A | 101 | 19 | 19 |
| 2 | 192 | 23 | 12 |
| 2 | 104 | 46 | 45 |
| 3 | 102 | 102 | 100 |
| 3 | 75 | 30 | 40 |
| 3 | 101 | 97 | 97 |
| 3 | 215 | 174 | 81 |

As seen from Table IV, all the these cells consistently produced excess power, defined as the additional power obtained from the cell above the input joule heating (the variation is largely due to changes in film design which was part of this initial study). The estimated uncertainty in the excess power levels is about 20 mW, such that the results reported are quite definitive despite the relatively low absolute power levels. While the absolute excess powers densities are low in absolute value, when computed on the basis of power per unit volume of metal film, they are comparable with the earlier bead experiments. The point is that with this electrode configuration, only a small fraction of the cell volume contains active metal. When considered on this basis, these electrodes provide forefront results. For example, these electrodes provide excess powers of ~10–20 W/gram of metal (Pd, Ni, etc) in comparison to only 0.1–0.4 W/g reported by Miles a solid Pd electrode, or ~0.006 W/g reported recently from experiments at Stanford Research Institute using the "L. Case Catalyst" technique (Pd coated commercial catalysis particles) [15]. Thus, the present electrode cells offer an excess power density (per gram of metal) that is one or two orders of magnitude higher than that reported from other related experiments.

Such electrode devices can be scaled up to higher power cells incorporation of multiple electrodes into the electrolytic cell container in order to increase the "packing fraction" of film material (volume of MLTF vs. volume of substrate and electrolyte). With the present compact electrode design which has both the anode and cathode plated on a single glass plate, insertion of multiple electrodes in the calorimeter for testing purposes is also readily achievable. Consider, for example, a cell of the same volume, but with 100 glass plates that have electrodes sputtered on both sides (vs. present single-sided plates). Behavior of the electrodes the same as for the single electrode experiments reported here would produce about 38 W excess power with about 40 W input. In addition, if the MLTF layer design is upgraded to that employed in earlier thin-film bead experiments [12], which provide higher excess heat percentages, excess power gains approaching 500% could be obtained. Then, the excess power in the preceding example would approach 190 W. Such a unit provides the basis for an attractive practical battery-type unit. Then scale-up to a multi-kW unit for distributed power cells would follow the same lines, adding yet more electrodes. A key added technology would involve incorporation of a heat-electrical conversion system. Assuming higher temperature operation is achieved, the present electrode design lends itself nicely to use of an integrated electrode and energy converter.

A possible integrated cell arrangement is illustrated in FIG. 4, discussed above [see 14, 16, 17]. In one such embodiment, a solid-state heat-electrical converter such as thermoelectric material or a "quantum well" layer is directly sputtered on the electrode on the side not bonded to the thin-films. Channels between these plates alternate with coolant and electrolyte, electricity being extract directly from the thermoelectric or quantum well layers. Such an arrangement would provide the desired compactness while offering a simple arrangement for handling electrode maintenance. Since the thin-film electrodes could be mass-produced using semi-conductor-manufacturing techniques, a cost effective power cell can be envisioned.

Figure 10:
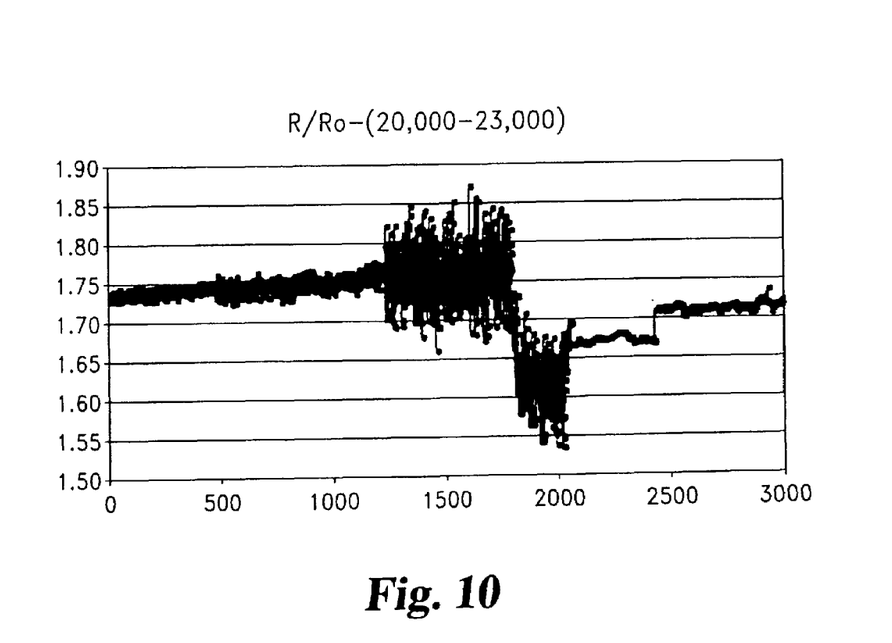
Figure 11:
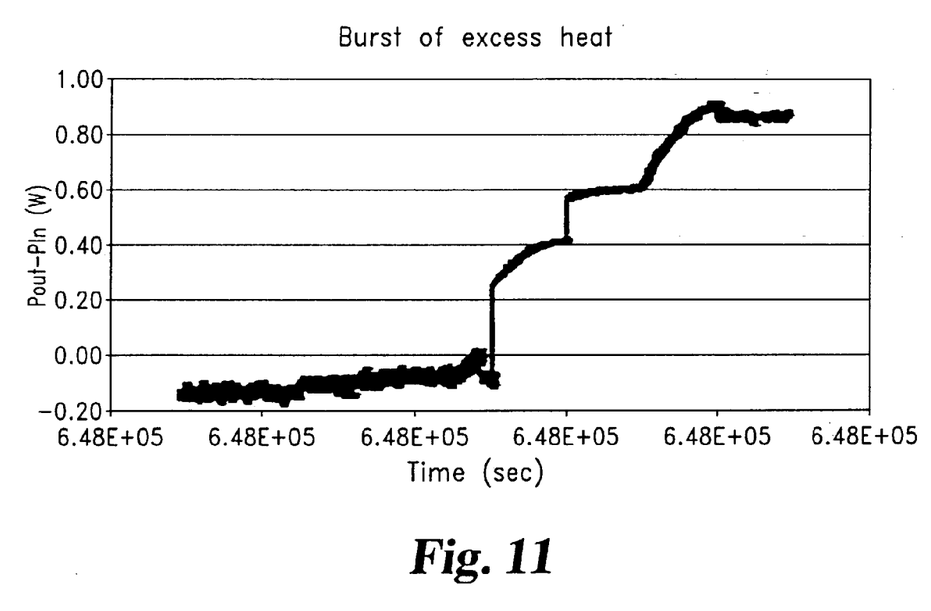

In further support of the plate type electrode studies, a basic hydrogen isotope loading experiment was carried out using a 50-mm diameter Pd wire, 1-m long, as the cathode [14]. This configuration provides electrical loading properties similar to the thin-film, but allows for easier diagnostics of the loading process itself. The configuration is related to other wire loading experiments by Celani, et al. [18], in which compatible results were observed. Thus it provides important supporting physics data. This wire was pre-conditioned and annealed to provide an oriented crystalline structure. The change in resistance of the wire was measured continuously during the loading process in order to determine the loading ratio (atoms H or D/atom Pd). At a loading of about 0.85, the resistance suddenly dropped to values well below the wire's initial value, as shown in FIG. 10. This rapid change is attributed to a phase change into the gamma phase of the D-Pd system. As seen from FIG. 11, the phase change was quickly followed by a short burst of high power output (order of kW) which rapidly heated the electrode, causing another phase change whereby the resistance returned to a value above the original. At that point, an excess power of ~1 Watt was obtained for about one hour before damage to the cell wiring forced shutdown of the run.

2. Hydride Storage Pressure Loading MLTF Cell Design

Electrolytic loading is attractive since it is well known that the electrolytic approach can produce very high loading ratio due to the effect of the double layer electrical potential that develops at the electrode. surface.. Indeed electrolytic loading of metals like palladium can obtain high values like 0.8 protons/atom, in contrast to other techniques such as high-pressure gas loading which is generally limited to less than 0.5 protons/atom. The reason this is possible with electrolytic techniques revolves around the fact that surface potentials provide a mechanism to ionize and then drive hydrogen into the metal in ionic form. Several prior studies of pressure loading, to obtain high proton/metal ratios in Pd electrodes have been reported by U. Maatermatero [2], and by X. Li [3]. Both of these studies are very positive in that excess heat production was achieved by the different techniques employed by these two researchers.

The present invention provides cells designs which employ loading ionic hydrogen from a hydride storage layer. In particular, as generally illustrated in FIGS. 5–7, the MLTF is coated on top of a hydride with an intermediate, platinum-black layer, and a small electric field is applied externally. Hydrogen released from the hydride by heating is ionized in the platinum-black layer and enters the MLTF. The electric field is set up to assist inward transport of the protons and also drive them along the MLTF layers. As seen from FIGS. 5–7, a barrier layer is placed in the center region between the hydride and the MLTF. Protons flow along the films behind the barrier layer so they do not reenter the hydride until they arrive at the opposite end of the film. Thus this design creates an electro-migration assisted technique to achieve an ultra-high proton loading and simultaneously provides a proton flow in the films. Flow is believed to be an advantageous component in facilitating the reactions. These flows are illustrated schematically in FIG. 7. In addition to the MLTF-hydride component, as shown in FIGS. 5–7, in the overall power cell using pressure loading, a thermo-electric converter and heat sink are provided as discussed in the general Description above. The center of the cylindrical cell is open to provide a large volume for initial loading of the hydrogen gas into the hydride. The gas is admitted into the cell at about 1 atmosphere while the hydride is resistively heated to several hundred degrees using an external battery. A barrier layer on the inner surface of the hydride admits gas flow into the hydride but retards flow in the opposite direction. Once the hydride is loaded, the hydrogen gas tank is removed and the cell valved off. The heater battery is also removed. In this condition the cell can be stored for extended periods of time without producing power. When operation is desired, the heating battery is reconnected and the hydrogen is driven out of the hydride at a temperature exceeding 350 degrees F. A battery is also connected to provide the bias field along the MLTF. Once the proton flow and loading are created, proton-metal reactions in the MLTF provide a vigorous heating source. At this point the external batteries are disconnected and the power cell is fully operational and portable.

The thermal-electric converter and heat sink are important components of this system when the production of electrical power is desired, which determine its overall efficiency and also may contribute a major fraction of the overall weight. It is possible to use a conventional thermo-electric converter, which operates with 4.5% efficiency with a 200-degree delta-T. It is expected however to be advantageous to employ an advanced quantum well type thermo-electric element, which could operate at 20% efficiency under similar conditions. Heat sink technology could use a small fan of the type employed in personal computers for air cooling. Aerodynamic fin designs can also be used.

REFERENCES

The following references and all other references cited in this document are indicative of the skills possessed by those practicing in the art and are hereby incorporated by reference their entirety as if each reference had been individually incorporated by reference and fully set forth.

[1] G. Preparata," QED Coherence in Matter", World Scientific Publishing Co., 1995

[2] U. Mastromatteo, "Hydrogen Loaded Thin Nickle Layers Show High Temperature Hot Spots", Proceedings Asti Workshop on Anomalies in Hydrogen/Deuterium Loaded Metals, Rocca d'Arazzo, 27–30 Nov. 1997, p. 63.

[3] X. Z. Li, S. X. Zheng, H. F. Huang, G. S. Huang, W. Z. Yu, "New Measurements of Excess Heat in a Gas Loaded D-PD System", Proceedings ICCF7, p. 197.

[4] Hi-Z technology, Inc., San Diego, Calif.

[5] Staff writers, "Cooling Solution: A surprise heat sink design prepares a computer manufacturer for the next wave of hotter, faster CPUs", *Mechanical Engineering*, p. 78 July 2000.

[6] Hartley, F. R., "The chemistry of platinum and palladium, with particular reference to complexes of the elements". New York, Wiley. 1973.

[7] Thorne, L. R, "Platinum catalytic igniters for lean hydrogen—air mixtures", Nuclear Regulatory Research, Washington D.C., 1988.

[8] Y. Fukai: The Metal Hydrogen Systems: *Springer Series in Material Science* #21. Berlin, Springer (1993).

[9] E. Yamaguchi and T. Nishioka: *Japan J. Appl. Phys.*, 26, L666 (1990).

[10] A. G. Lipson, A. S. Roussetski, B. F. Lyakhov et al: *Fusion Tech*, 38, 155 (2000).

[11] O. Joshiro, K. Naokara and J. Murata: *J. Polymer Sci Polymer Phys.*, 24, 2059, (1986).

[12] Miley, G. H., "Possible Evidence of Anomalous Energy Effects in H/D-Loaded Solids Low Energy Nuclear Reactions (LENRS), *Journal of New Energy*, 2, no. 3–4, pp. 6–13.

[13] Miley, G. H. "Characteristics of Reaction Product Patterns in Thin Metallic Films Experiments," Proceedings, Asti Workshop on Anomalies in Hydrogen/Deuterium Loaded Metals, Asti, Italy, Nov. 27–30, 1997.

[14] George H. Miley, et al., "Experimental Status and Potential Applications of a Thin-Film Low Energy Nuclear Reaction (LENR) Power Cell", *ICONE*-8, April 2000

[15] McKubre, M. "Recent Loading and Excess Heat Experiments at SRI," *Proc., ASTI Workshop on Anomalies in H/Loaded Metals*, Nov. 27–30, Asti, Italy, Societa Italiana di Fisica, Bologna, Italy, 1999.

[16] Miley, G. H., "Emerging Physics For a Breakthrough Thin-Film Electrolytic Cell Power Unit", *AIP Conference Proceedings* 458, pp. 1227–1231, *Space Technology & Applications International Forum,* University of New Mexico, Albuquerque, N.Mex., Jan. 31 to Feb. 4, (1999)

[17] George H. Miley and Eric Rice, "Low Energy Reaction Cell for Advanced Space Power Applications" *Proceedings Space Technology & Applications International Forum,* University of New Mexico, Albuquerque, N.Mex., Feb. 11 to Feb. 15, (2001).

[18] F. Celani, et al., "A Preliminary D/Pd Loading Study: Anomalous Resistivity Transition Effect," *Proc., Asti Workshop on Anomalies in H/D Loaded Metals*, ASTI '97, Societa Italiana di Fisica, Bologna, Italy, 1999, pp 7–16.

What is claimed is:

1. A device suitable for energy conversion, comprising:
   at least one electrode device, said electrode device comprising;
   a substrate;
   a first electrode on the substrate, said first electrode comprising multiple metal layers including at least one layer of a first metal and at least one layer of a second metal; and
   a second electrode on the substrate in a location discrete from said first electrode; and
   at least one thermoelectric converter element.

2. The device of claim 1, wherein said layers each have a thickness in the range of about 50 to about 1000 Angstroms.

3. The device of claim 1, wherein said first metal and said second metal have a Fermi level difference of at least about 0.5.

4. The device of claim 1, wherein said first electrode further includes a barrier layer, and wherein at least a portion of said multiple layers are positioned between said barrier layer and said substrate.

5. The device of claim 1, wherein said first metal is palladium.

6. The device of claim 5, wherein the layer of palladium has a thickness in the range of about 50 to about 1000 Angstroms.

7. The device of claim 6, wherein said first electrode has at least 5 metal layers, said metal layers including at least two layers of palladium.

8. The device of claim 1, wherein said substrate is substantially planar.

9. The device of claim 1, wherein said substrate comprises a concave surface, and wherein said first electrode is positioned upon said concave surface.

10. The device of claim 1, wherein said substrate is non-conductive.

11. The device of claim 10, wherein said substrate comprises glass or ceramic.

12. The device of claim 1, wherein said metal layers are formed by sputtering and/or plasma deposition.

13. The device of claim 12, wherein said first metal and said second metal have a Fermi level difference of at least about 0.5.

14. The device of claim 13, wherein said first metal is palladium.

15. The device of claim 1, comprising a plurality of said electrode devices.

16. The device of claim 15, comprising a plurality of thermoelectric converter elements.

17. The device of claim 15, wherein said electrode devices are substantially planar.

18. The device of claim 17, also comprising a plurality of thermoelectric converter elements, said electrode devices and thermoelectric converter elements arranged in an alternating fashion.

19. A device suitable for energy conversion, comprising:
   at least one cell device comprising:
      a source of ions of hydrogen or an isotope thereof;
      an electrically conductive element including a metal in which said ions are soluble; and
      said cell device configured to cause electro-migration of said ions so as to form a region within said conductive element enriched with said ions; and
   at least one thermoelectric converter element.

20. The device of claim 19, wherein said conductive element comprises multiple metal layers.

21. The device of claim 20, wherein said multiple metal layers include at least one layer of a first metal and at least one layer of a second metal.

22. The device of claim 21, wherein said first metal is palladium.

23. The device of claim 19, also comprising a barrier layer configured to promote formation of said enriched region of said conductive element.

24. The device of claim 19, wherein said source of ions comprises a liquid electrolyte.

25. The device of claim 24, wherein said conductive element comprises at least one layer of a first metal adjacent to at least one layer of a second metal.

26. The device of claim 19, wherein said source is a solid source.

27. The device of claim 26, wherein said conductive element includes multiple metal layers.

28. The device of claim 27, wherein said multiple layers include a layer of a first metal adjacent to a layer of a second metal.

29. The device of claim 28, wherein said first metal and said second metal have a Fermi level difference of at least about 0.5.

30. The device of claim 26, wherein said solid source comprises a metal hydride.

31. The device of claim 30, also comprising a catalyst for converting gaseous hydrogen or an isotope thereof to a corresponding ionic hydrogen or an isotope thereof.

32. The device of claim 31, wherein said catalyst comprises platinum black.

33. The device of claim 30, also comprising an amount of gas of hydrogen or an isotope thereof in communication with said metal hydride.

34. A cell device comprising:
   a solid source of ions of hydrogen or an isotope thereof, said solid source formed as a layer having a generally cylindrical shape;
   a conductive element in which said ions are soluble, said conductive element formed as a layer having a generally cylindrical shape;
   a closed container that is generally cylindrical in shape, the closed container having an interior, with said solid source and said conductive element located in said interior, and said solid source and said conductive element corresponding in shape to an internal surface of said container;
   an anodic connection to said conductive element at a first location;
   a cathodic connection to said conductive element at a second location;
   a barrier layer located between said anodic connection and said cathodic connection;
   said solid source arranged to provide said ions into said conductive element upon the application of current through said conductive element;
   said solid source effective to exchange said ions to and from said conductive element on either side of said barrier layer, but not through said barrier layer; and
   a thermoelectric converter element in heat-exchange relationship with said conductive element and with said container.

35. The device of claim 34, also comprising heat transfer elements external of said container.

36. The device of claim 34, wherein said conductive element comprises multiple metal layers.

37. The device of claim 36, wherein said multiple metal layers include at least one layer of a first metal and at least one layer of a second metal.

38. The device of claim 36, wherein said layers each have a thickness in the range of about 50 to about 1000 Angstroms.

* * * * *